United States Patent
Hawes et al.

(10) Patent No.: US 6,221,514 B1
(45) Date of Patent: Apr. 24, 2001

(54) HIGH-CURRENT CIRCUIT TRACE AND COMPOSITION AND METHOD THEREFOR

(75) Inventors: Kevin Joseph Hawes, Greentown; David Jay Vess, Kokomo; Dwadasi Hare Rama Sarma, Kokomo; Bradley Howard Carter, Kokomo; Jerome Anthony Schneider, Kokomo, all of IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/385,051

(22) Filed: Aug. 30, 1999

(51) Int. Cl.[7] ............................. B32B 15/02; B23K 35/22
(52) U.S. Cl. ........................... 428/646; 148/23; 148/522; 148/527; 174/126.1; 174/126.2; 228/223; 228/37; 228/39; 428/647; 428/546; 428/901; 428/931; 420/558
(58) Field of Search ................................. 428/646, 647, 428/546, 901, 931; 228/223, 37, 39; 148/23, 522, 527; 174/126.1, 126.2; 420/558

(56) References Cited

U.S. PATENT DOCUMENTS 5,011,658 * 4/1991 Niedrich ............................. 420/558
5,390,845 2/1995 McDonald ........................... 228/223

* cited by examiner

Primary Examiner—Deborah Jones
Assistant Examiner—Robert R. Koehler
(74) Attorney, Agent, or Firm—Jimmy L. Funke

(57) ABSTRACT

A method by which a conventional circuit trace (14) is modified with a layer (16) of high-conductivity solder alloy to yield a high-current circuit trace (12) for high-current routing on a substrate (10). The method generally entails the use of a solder composition that contains a dispersion of metal particles (18) in a solder alloy (20). The metal particles (18) are selected on the basis of having a higher electrical conductivity than the solder alloy (20), and are present in sufficient amounts so that the electrical conductivity of the solder composition is significantly higher than that of the solder alloy (20). The solder composition is deposited on a conductor (14), and then reflowed to form a conductive layer (16) on the conductor (14). The metal particles (18) remain as a discrete dispersion within the conductive layer (16) in order to suitably promote the conductivity of the layer (16). The solder composition is preferably deposited in an amount sufficient to increase the current-carrying capacity of the resulting circuit trace (12) for high-current routing on the substrate (10), e.g., in excess of six amps.

30 Claims, 3 Drawing Sheets

HIGH-CURRENT CIRCUIT TRACE AND COMPOSITION AND METHOD THEREFOR

TECHNICAL FIELD

The present invention generally relates to electrical circuits that require high-current routing. More particularly, this invention relates to a method of modifying a circuit trace with a layer of high-conductivity solder alloy to yield a high-current circuit trace for high-current routing.

BACKGROUND OF THE INVENTION

Conductor traces for laminate circuit boards are often formed of thin copper plating or foil, often in the range about 0.0015 to about 0.0028 inches (about 0.038 to about 0.071 mm) in thickness. Such thicknesses are well suited for carrying relatively low currents, e.g., up to about six amps for traces with widths of about 0.1 inch (about 2.5 mm), but are susceptible to overheating if higher currents are carried. In the development of bussed electrical modules (BEM), both high-current and low-current circuits are required in the same module. In the past, surface-mount bus bars have been employed to form high-current paths where needed. However, bus bars are manufactured separately and must then be assembled and soldered to the circuit board, incurring additional material and assembly costs. Accordingly, it would be desirable if another method were available for incorporating high-current routing on a circuit board, preferably in a manner that does not require the placement of a discrete component and is compatible with the processing of laminate circuit boards with thin copper traces.

SUMMARY OF THE INVENTION

According to the present invention, there is provided a method by which a conventional circuit trace is modified with a layer of high-conductivity solder alloy to yield a high-current circuit trace for high-current routing on a circuit board. The method generally entails the use of a solder composition that contains a dispersion of metal particles in a solder alloy. The metal particles are selected on the basis of having a higher electrical conductivity than the solder alloy, and are present in sufficient amounts so that the electrical conductivity of the solder composition is significantly higher than that of the solder alloy. The solder composition is deposited on a circuit conductor, and then reflowed to form a conductive layer on the conductor. The metal particles remain as a discrete dispersion within the conductive layer in order to suitably promote the conductivity of the layer. The solder composition is preferably deposited in an amount sufficient to increase the current-carrying capacity of the resulting circuit trace for high-current routing on the circuit substrate, e.g., in excess of six amps.

According to the invention, the amount, size and geometry of the metal particles have been determined to affect the conductivity of the conductive layer, as well as influence the surface tension and rheology flow properties of the solder composition during deposition on the conductor. Tests have further shown that particles appropriately chosen for size and geometry can, when present in suitable quantities, inhibit the flow of the molten solder during reflow to maintain a more uniform cross-section for the conductive layer. Deposition of the solder composition is preferably performed with a stencil whose configuration is specially adapted to the rheology of the solder composition, as well as to the process of selectively and uniformly depositing the composition on narrow parallel conductors to achieve uniform coverage and thickness of the resulting conductive layers without shorting between adjacent conductors.

In view of the above, a significant advantage of the method and solder composition described above is the elimination of the need for discrete bus bars that must be selectively mounted to a circuit to provide high-current routing. Instead, the present invention is compatible with conventional laminate circuit board structures, and involves modifying an otherwise conventional low-current conductor trace to yield a high-current circuit trace of consistent quality. Accordingly, high-current circuit traces can be readily formed essentially anywhere high-current routing is required on a substrate, and at a cost that can be significantly lower than possible with the prior art use of bus bars.

Other objects and advantages of this invention will be better appreciated from the following detailed description.

DESCRIPTION OF THE PREFERRED EMBODIMENT

Figure 1:
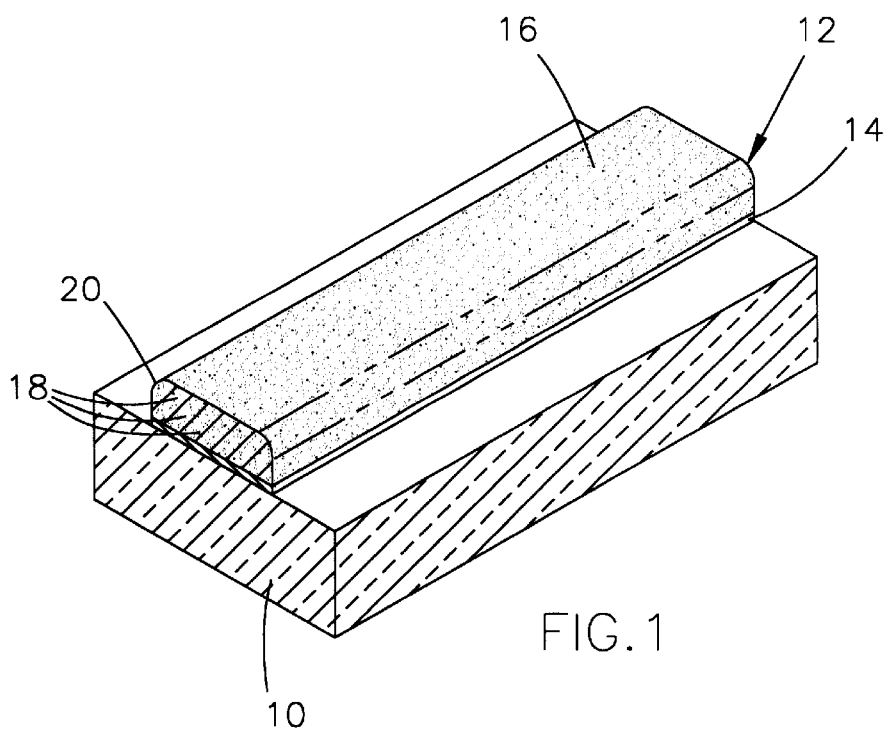
FIG. 1 is a partial cross-sectional view of a thin conductor trace on which a high-conductivity solder layer is formed in accordance with this invention to yield a high-current circuit trace.

Shown in FIG. 1 is a high-current circuit trace 12 formed by a conductor trace 14 modified with a high-conductivity solder layer 16 in accordance with this invention. The circuit trace 12 is shown on a substrate 10 that can be of essentially any type, including a printed circuit board (PCB), printed wiring board (PWB), flexible circuit, or a silicon, ceramic or insulated metal substrate, as is known in the art. The invention is particularly advantageous when used with laminate circuit boards, an example of which is a glass-reinforced or woven fiberglass-reinforced epoxy resin laminate available from various sources as AFR4≅ or AG-10.≅. The invention finds use but is not limited to bussed electrical modules that require circuit traces for high-current routing (typically ten amps or more) and for low-current routing (typically six amps or less). According to this invention, the conductor trace 14 is preferably a copper trace having a thickness of about 1.4 mils (1 oz. copper) to about 2.8 mils (2 oz. copper) (about 35 to about 70 micrometers), though it is foreseeable that thinner and thicker traces could be formed and other trace compositions could be used. In the case of applications with high and low currents including fine line component lead spacing (up to about 50 mils (about 1.27 mm)), high volume production technology will typically limit the maximum conductor trace thickness to about 2.8 mils (2 oz. copper) due to pad underetch issues. A typical width for the trace 14 is about 20 to about 500 mils (about 0.51 to about 12.7 millimeters), though the trace width may vary depending upon the particular constraints of the application.

The high-conductivity solder layer 16 is formed by a solder composition containing a dispersion of metal particles 18 in a solder alloy matrix 20. The solder alloy is generally chosen on the basis of solderability with the trace 14 and the operating temperatures of the substrate 10. While the invention will be illustrated with a tin-lead solder as the solder alloy matrix 20, the use of other solder alloys is within the scope of this invention. According to the invention, the metal particles 18 are selected on the basis of having a higher electrical conductivity than the solder alloy, and are present in sufficient amounts within the solder layer 16 so that the electrical conductivity of the solder layer 16 is significantly higher than that of the solder alloy. A number of different metals and alloys could be used as the particles 18 of this invention, including copper, silver and their alloys. Copper is generally preferred as being highly conductive, relatively inexpensive, compatible with tin-lead solders and, of importance to this invention, having a sufficiently high melting temperature so as not to go into solution in the solder alloy. As a result, copper particles can be added to the solder composition and remain as discrete particles within the high-conductivity solder layer 16 during processing and service. To promote their ability to remain as discrete particles within the solder matrix 20 without dissolving into the solder composition, the metal particles 18 preferably have a minimum particle dimension of about 5.0 mils (about 127 micrometers). A maximum particle dimension is on the order of about 20 to 50 mils (about 0.5 to 1.3 mm), and is generally determined by the ability to deposit the solder composition using such conventional equipment as stencils and paste dispensing machines.

Deposition of the solder composition on the trace 14 is preferably performed by stenciling, in which the solder composition is in the form of a paste formed by mixing the metal particles 18 with particles of the solder alloy with a flux. The paste is then applied to the trace 14 by being loaded on a stencil and then pushed through an opening in the stencil that has been aligned (usually optically) to the trace 14. The solder composition is then reflowed, during which the flux is vaporized or burned off, and the solder paste containing the metal particles is allowed to melt and flow on the surface of the trace 14, yielding the conductive solder layer 16 upon solidification. Importantly, the metal particles do not melt during reflow, but remain as discrete particles within the molten solder alloy and the resulting conductive solder layer 16. To achieve a suitable rheology for the paste, the metal particles 18 constitute about 5% to about 70% by weight, preferably about 25% by weight, of the combined weight of the metal particles 18 and solder alloy. The solder composition may be composed of about 85% to about 92% by weight, preferably 88% by weight, of the solder alloy and metal particles 18 combined, with the balance being a suitable flux for the particular solder alloy used. After forming the solder composition, a suitable process flow is to stencil or dispense the solder composition for the solder layer 16, and then stencil a conventional solder paste on other circuit board areas for conventional surface mount device placement and reflow. Surface mount components can then be placed, and the solder composition and paste reflowed to form the trace 12, generally as shown in FIG. 1. Concurrently, the conventional solder paste is also reflowed to secure other surface mount devices to the board.

During investigations leading to the present invention, solder compositions were prepared to evaluate the effect that metal particle content and geometry might have on the conductivity of a tin-lead solder stenciled on a copper conductor trace. A first investigation used four conductor traces, each having a thickness of about 0.002 inch (about 51 micrometers) and a width of about 0.087 inch (2.2 mm). One of the traces (Trace 1) was left bare as a baseline, Trace 2 was coated with a solder paste mixture of about 10% by weight flux and about 90% by weight of 63Sn-37Pb solder alloy powder applied to a maximum (meniscus) height of about 30 mils (about 0.76 mm) after reflow. Trace 3 was coated with a solder composition composed of about 23% by weight copper filings, about 69% by weight of the same 63Sn-37Pb solder alloy powder, and about 8% by weight flux. The copper filings were generally C-shaped or spiral-shaped with lengths of roughly 7 mils (about 178 micrometers) and widths of roughly 5.0 mils (about 127 micrometers). The copper-laden solder composition had maximum (meniscus) thicknesses of about 30 mils (about 0.76 mm), similar to the solder-only specimens. Trace 4 was equipped with a standard surface-mount bus bar formed of C11000 commercially-pure copper, and having a width of about 87 mils (about 2.2 mm) and a thickness of about 32 mils (about 0.8 mm).

Figure 2:
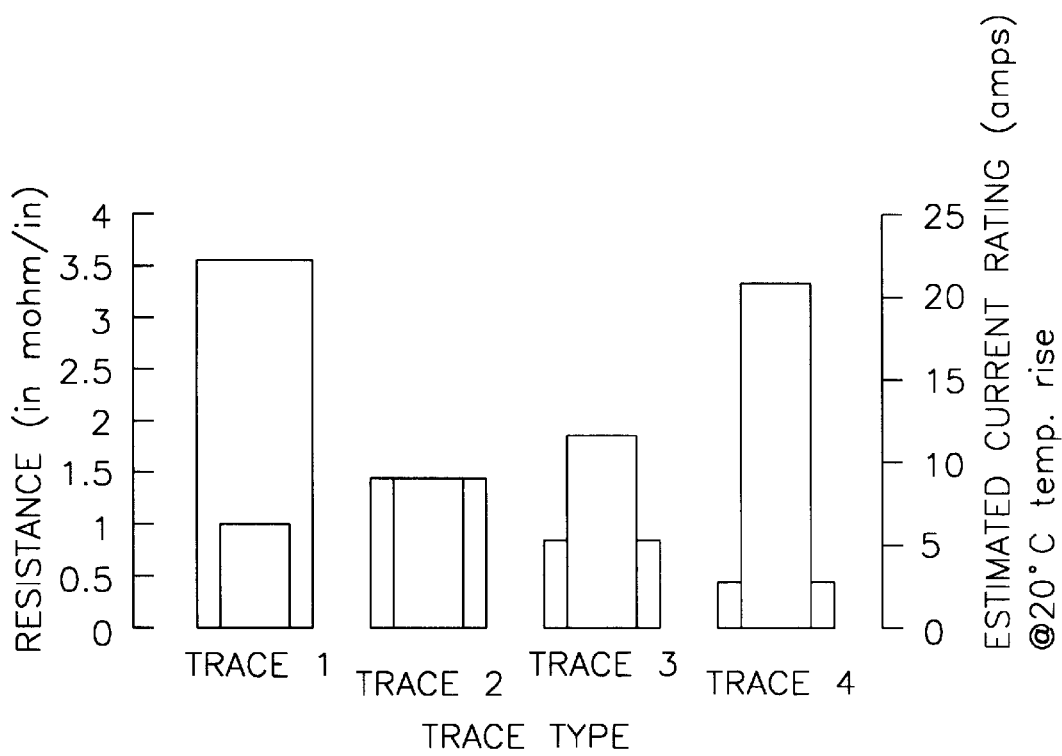
FIGS. 2 through 4 are graphs representing conductivity data for high-current circuit traces in accordance with the present invention in comparison to low-current traces, traces coated with tin-lead solders, and traces equipped with surface-mount bus bars of the prior art.

FIG. 2 represents the results of tests performed on the four traces for resistance (mohms/inch), and the estimated current rating for a 20EC temperature rise. FIG. 2 evidences that Trace 3, coated with a copper-laden solder layer in accordance with this invention, exhibited a considerable improvement (about 38%) in conductivity over the trace coated with only solder alloy.

Figure 3:
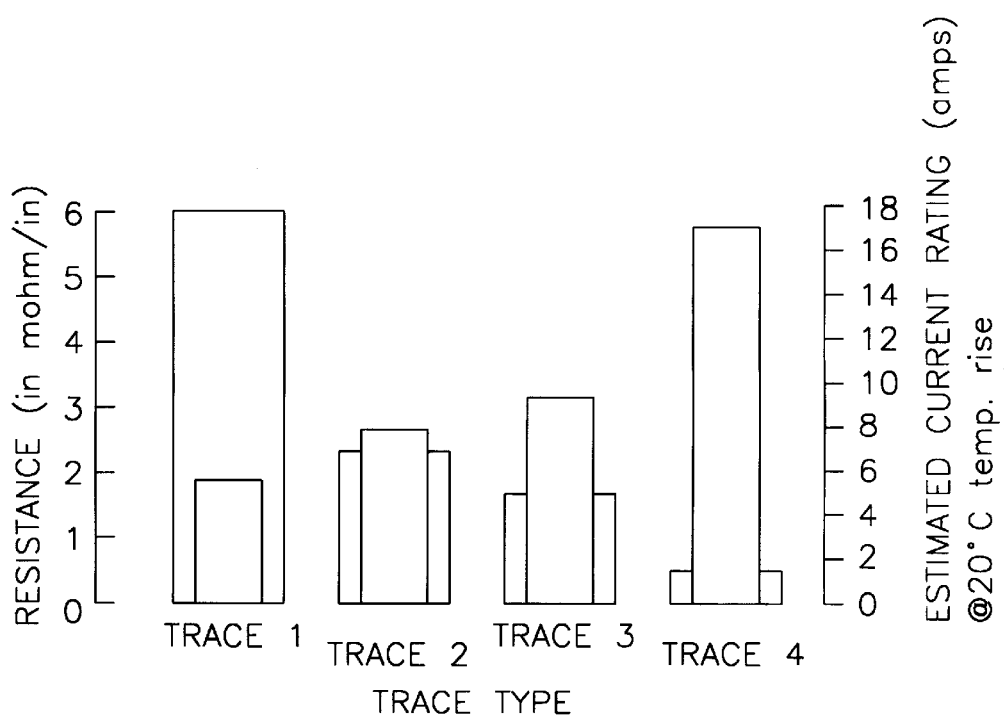

With reference to FIG. 3, a second investigation was performed on four copper traces having thicknesses of about 0.001 inch (about 25 micrometers) and widths of about 0.087 inch (2.2 mm). Trace 1 was again a bare copper trace. A 60Sn-40Pb solder paste was applied to Trace 2 to a maximum (meniscus) thickness of about 22 mils (about 0.55 mm). On Trace 3, a solder composition was applied that was composed of about 74.8% by weight 60Sn-40Pb solder alloy powder (270/400 mesh), about 13.8% by weight copper filaments cut from solderwick, and about 11.4% by weight of a flux commercially-available from Heraesus under the name F-365. The solderwick filaments were about 99% copper with added flux. On this basis, the copper particles constituted about 15.6% by weight of the metal component of the solder composition and the resulting high-conductivity solder layer. The copper filaments were generally elongate with lengths of about 5 to 20 mils (about 125 to about 500 micrometers) and widths of about 2 mils (about 50 micrometers). The copper-laden solder compositions had maximum (meniscus) heights of about 21 mils (about 0.53 mm) after reflow, which was slightly less than the solder-only specimen. Trace 4 was equipped with a standard surface-mount bus bar essentially identical to that previously tested.

The four traces were then tested for resistance (mohms/inch) as done previously in the first investigation. The results of these tests and the estimated current ratings for a 20EC temperature rise are presented in FIG. 3. The increase in resistance and drop in current rating can generally be attributed to the thinner copper traces tested. Again, this test evidenced that traces coated with a copper-laden solder layer in accordance with this invention exhibit a significant improvement (about 31%) in conductivity over copper traces coated only with solder alloy.

An important observation in all groups of test specimens with copper-laden solder layers was the effect that the copper particles had on the ability to deposit a more uniformly thick coating on the traces, similar to that depicted in FIG. 1. In contrast, traces coated with only solder tended to exhibit solder flow along the trace. External effects such as the presence of air flow within the reflow oven, slight tipping of the board causing a downhill flow, or varying surface tension due to trace geometries such as corners, all contributed to an uncontrolled and uneven coating of the solder.

In a third investigation, the addition of copper powders to 63Sn-37Pb solder alloy was evaluated. The particles were evaluated in three different sizes of about 25, 44, and up to 100 micrometers, and combined with a 63Sn-37Pb solder alloy powder and flux in a ratio of about 17:75:8 by weight. While contributing comparable rheological benefits in terms of deposition and the ability to form a uniformly thick coating, the copper particles dissolved in the solder during reflow. Subsequent testing evidenced that the resistances of copper traces coated with the copper-containing solder alloy and the trace coated with only 63Sn-37Pb solder did not differ significantly, though some improvement was realized with increasing particle size. From this investigation, it was concluded that a minimum particle size for copper particles used with the solder composition of this invention should be at least 5 mils (about 127 micrometers), and more preferably about 10 mils (about 254 micrometers) or more.

Figure 4:
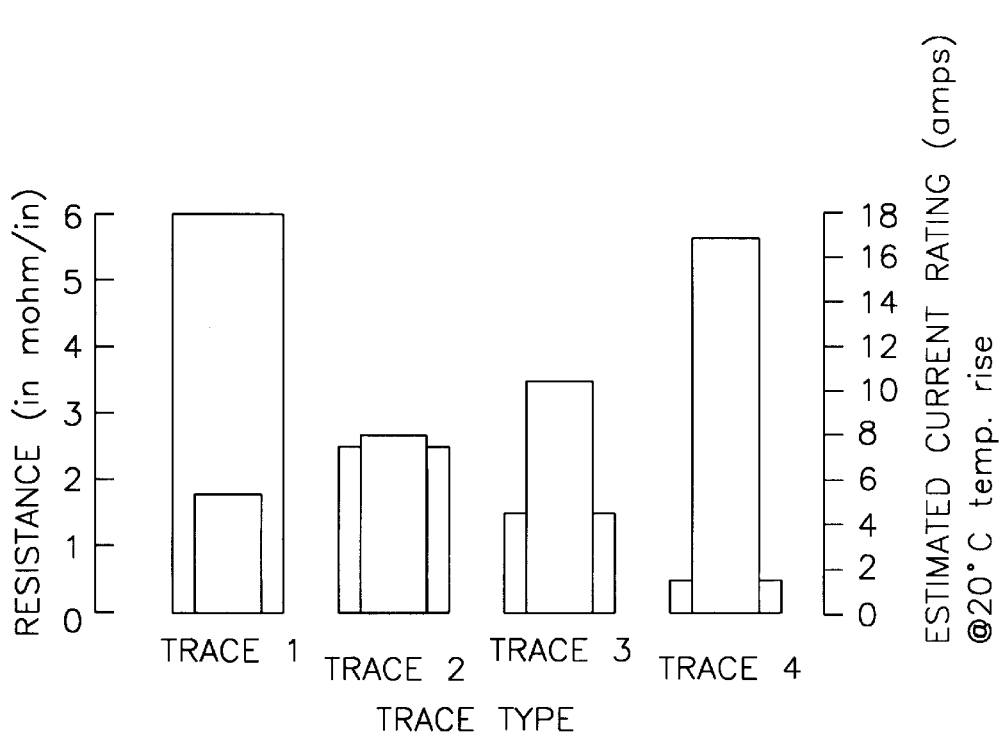

With reference to FIG. 4, a fourth investigation was performed with four conductor traces having thicknesses of about 0.001 inch (about 25 micrometers) and widths of about 0.087 inch (2.2 mm). As with previous investigations, Trace 1 was left bare. A 60Sn-40Pb solder paste was applied on Trace 2 to a maximum (meniscus) thickness of about 26 mils (about 0.66 mm). On Trace 3, a solder composition was applied that was composed of about 66% by weight 60Sn-40Pb solder alloy powder (270/400 mesh), about 22% by weight copper shot, and about 12% by weight of a flux commercially-available from Heraesus under the name F-365. On this basis, the copper particles constituted about 25% by weight of the metal component of the solder composition and the resulting conductive solder layer. The copper shot particles were generally elongate with lengths of about 20 mils (about 500 micrometers) and diameters of about 10 mils (about 254 micrometers). The copper-laden solder compositions had thicknesses of about 24 mils (about 0.61 mm) after reflow, which was slightly less than the solder-only specimens. Trace 4 was again equipped with a standard surface-mount bus bar essentially identical to that previously tested.

All four traces were then tested for resistance (mohms/inch) as done previously in the prior investigations. The results of these tests and the estimated current ratings for a 20EC temperature rise are presented in FIG. 4, and show that the traces coated with the copper shot-laden solder layers exhibited an improvement of about 40% in conductivity over the copper traces coated only with solder alloy. In addition, these tests indicated the importance of the particle size on the ability of the particles to remain effective within the solder layer to increase the conductivity and current rating of a copper trace. Also confirmed was the effect that the copper particles had on the ability to deposit a more uniformly thick coating on the traces.

Figure 5:
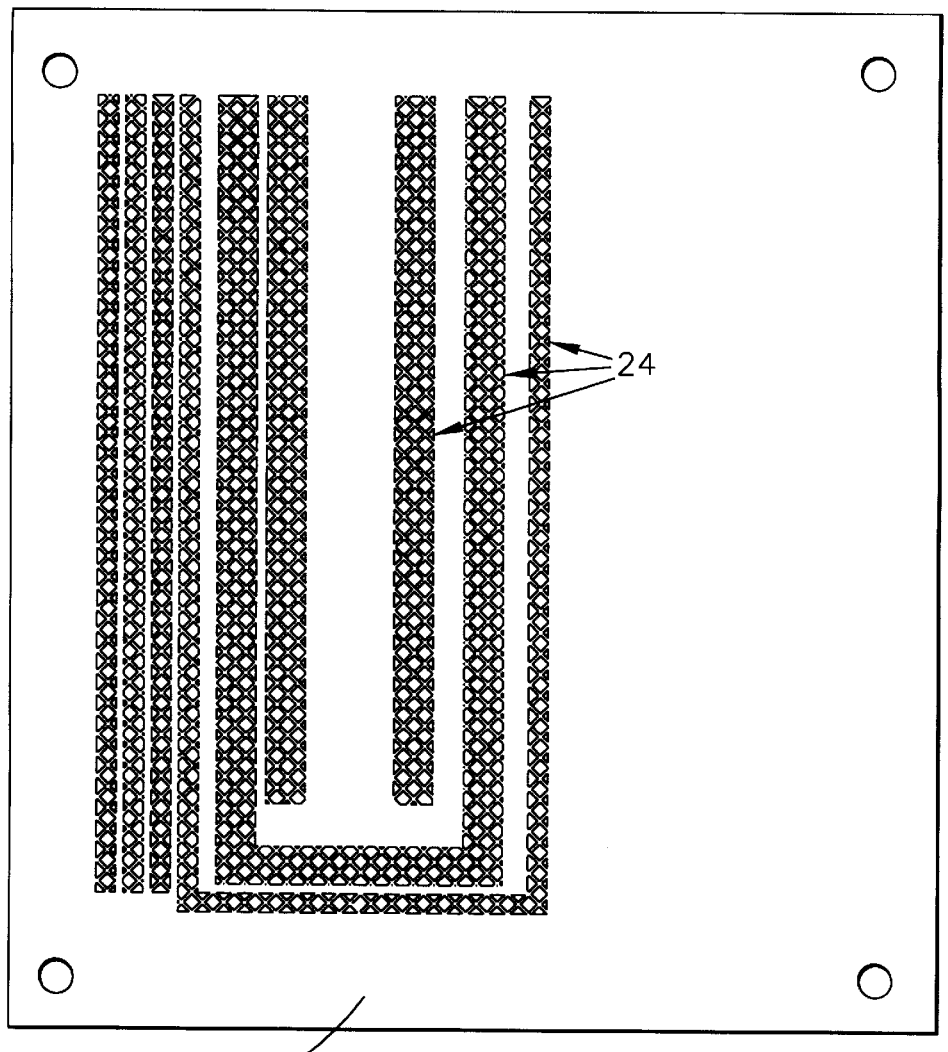
FIGS. 5 and 6 are plan and detail views, respectively, of a stencil for printing the high-conductivity solder layer of FIG. 1.
Figure 6:
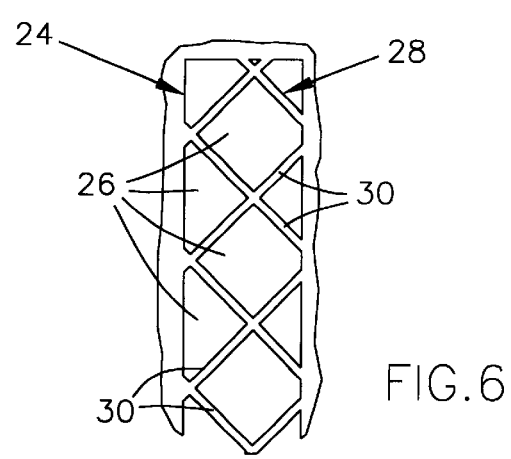

During the above investigations, a stencil for depositing a particle-laden solder alloy was shown to benefit from a particular type of opening pattern. The stencil 22, illustrated in FIG. 5, includes an opening 24 for each trace to be coated. As seen in greater detail in FIG. 6, each opening 24 is composed of a number of discrete square-shaped openings 26 that are separated by a crosshatched web pattern 28, each formed by individual webs 30 that are disposed diagonally (roughly 45 degrees) to the width-wise direction of the opening 24. While the particular dimensions of the stencil 22 could foreseeably vary based on the particular rheological flow properties of the particle-laden solder composition, suitable dimensions include a stencil thickness of about 8 mils to about 30 mils (about 0.2 to about 0.8 mm), preferably about 20 mils (about 0.5 mm), widths of about 50 mils to about 100 mils (about 1.3 to about 2.5 mm), preferably about 62 mils (about 1.6 mm) for the discrete openings 26, and individual webs with widths of about 8 mils to about 12 mils (about 0.2 to about 0.3 mm), preferably about 10 mils (about 0.25 mm).

While our invention has been described in terms of a preferred embodiment, other forms could be adopted by one skilled in the art. Accordingly, the scope of our invention is to be limited only by the following claims.

What is claimed is:

1. A solder composition containing a dispersion of metal particles in a solder alloy, the metal particles having a higher electrical conductivity than the solder alloy, the solder composition having a higher electrical conductivity than the solder alloy.

2. A solder composition according to claim 1, wherein the solder alloy is a tin-lead alloy.

3. A solder composition according to claim 1, wherein the metal particles consist essentially of copper.

4. A solder composition according to claim 3, wherein the metal particles constitute about 5 to about 70% by weight of the combined weight of the metal particles and solder alloy.

5. A solder composition according to claim 1, wherein the metal particles have an elongate shape with a minimum particle dimension of about 127 micrometers and a maximum particle dimension of about 1.3 mm.

6. A solder composition according to claim 1, further comprising about 8 to about 15% by weight flux.

7. A solder composition according to claim 1, wherein the solder alloy is a tin-lead alloy, and wherein the metal particles consist essentially of copper, constitute about 5 to about 70% by weight of the combined weight of the metal particles and solder alloy, and have an elongate shape with a minimum particle dimension of about 127 micrometers and a maximum particle dimension of about 1.3 mm.

8. A solder composition according to claim 1, wherein the solder composition is in the form of a coating on a circuit trace.

9. A solder composition according to claim 1, wherein the solder composition is in the form of a paste.

10. A circuit trace comprising:
   a conductor on a substrate; and
   a layer of a solder composition on the conductor, the solder composition containing a dispersion of metal particles in a solder alloy, the metal particles having a higher electrical conductivity than the solder alloy, the solder composition having a higher electrical conductivity than the solder alloy.

11. A circuit trace according to claim 10, wherein the solder alloy is a tin-lead alloy.

12. A circuit trace according to claim 10, wherein the metal particles consist essentially of copper.

13. A circuit trace according to claim 10, wherein the metal particles constitute about 5 to about 70% by weight of the combined weight of the metal particles and solder alloy.

14. A circuit trace according to claim 10, wherein the metal particles have an elongate shape with a minimum particle dimension of about 127 micrometers and a maximum particle dimension of about 1.3 mm.

15. A circuit trace according to claim 10, wherein the solder alloy is a tin-lead alloy, and wherein the metal particles consist essentially of copper, constitute about 5 to about 70% by weight of the combined weight of the metal particles and solder alloy, and have an elongate shape with a minimum particle dimension of about 127 micrometers and a maximum particle dimension of about 1.3 mm.

16. A circuit trace according to claim 10, wherein the circuit trace routes current of at least ten amps between two other conductors on the substrate.

17. A circuit trace according to claim 10, wherein the circuit trace is a component of a bussed electrical module, the bussed electrical module comprising conductors having electrical conductivities lower than the circuit trace.

18. A method of forming a circuit trace on a substrate, the method comprising the steps of:
forming a solder composition containing a dispersion of metal particles in a solder alloy, the metal particles having a higher electrical conductivity than the solder alloy, the solder composition having a higher electrical conductivity than the solder alloy;
depositing the solder composition on a conductor on the substrate; and then
reflowing the solder composition to form a conductive layer of the solder alloy with a dispersion of the metal particles therein.

19. A method according to claim 18, wherein the solder alloy is a tin-lead alloy.

20. A method according to claim 18, wherein the metal particles consist essentially of copper.

21. A method according to claim 18, wherein the metal particles constitute about 5 to about 70% by weight of the combined weight of the metal particles and solder alloy.

22. A method according to claim 18, wherein the metal particles have an elongate shape with a minimum particle dimension of about 127 micrometers and a maximum particle dimension of about 1.3 mm.

23. A method according to claim 18, wherein the circuit trace routes current of at least ten amps between two other conductors on the substrate.

24. A method according to claim 18, wherein the circuit trace is a component of a bussed electrical module, the bussed electrical module comprising conductors having electrical conductivities lower than the circuit trace.

25. A method according to claim 18, wherein the solder composition is deposited using a stencil in which an opening pattern is formed through which the solder composition is deposited onto the conductor, the opening pattern comprising a plurality of discrete openings that are separated by a cross-hatched web pattern.

26. A method according to claim 25, wherein the discrete openings have widths of about 1.3 to about 2.5 mm.

27. A method according to claim 25, wherein the cross-hatched web pattern comprises individual webs that are disposed diagonally to a width-wise direction of the opening pattern.

28. A method according to claim 25, wherein the individual webs have widths of about 0.2 to about 0.3 mm.

29. A method according to claim 25, wherein the stencil has a thickness of about 0.2 to about 0.8 mm.

30. A method according to claim 25, wherein the stencil has a thickness of about 0.5 millimeters, the discrete openings have widths of about 1.6 millimeters, the cross-hatched web pattern comprises individual webs that are disposed diagonally to a width-wise direction of the opening pattern, and the individual webs have widths of about 0.25 millimeters.

* * * * *